US009767741B2

(12) United States Patent
Bai et al.

(10) Patent No.: US 9,767,741 B2
(45) Date of Patent: Sep. 19, 2017

(54) ORGANIC ELECTROLUMINESCENT DISPLAY DEVICE, DRIVING METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Shanshan Bai, Beijing (CN); Fengli Ji, Beijing (CN); Minghua Xuan, Beijing (CN); Jiantao Liu, Beijing (CN); Jingbo Xu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 14/769,083

(22) PCT Filed: Feb. 9, 2015

(86) PCT No.: PCT/CN2015/072538
§ 371 (c)(1),
(2) Date: Aug. 19, 2015

(87) PCT Pub. No.: WO2016/065770
PCT Pub. Date: May 6, 2016

(65) Prior Publication Data
US 2016/0253972 A1     Sep. 1, 2016

(30) Foreign Application Priority Data

Oct. 27, 2014   (CN) .......................... 2014 1 0584435

(51) Int. Cl.
*G09G 3/36*       (2006.01)
*G09G 3/3208*     (2016.01)
(Continued)

(52) U.S. Cl.
CPC ......... *G09G 3/3607* (2013.01); *G09G 3/2003* (2013.01); *G09G 3/3208* (2013.01);
(Continued)

(58) Field of Classification Search
None
See application file for complete search history.

(56) References Cited

U.S. PATENT DOCUMENTS 9,214,500 B2 * 12/2015 Chao .................... H01L 27/3218
2005/0001542 A1   1/2005 Kiguchi
(Continued)

FOREIGN PATENT DOCUMENTS

CN            1738501        2/2006
CN          101752407        6/2010
(Continued)

OTHER PUBLICATIONS

International Search Report with English Language Translation, dated Jun. 19, 2015, Application No. PCT/CN2015/072538.
(Continued)

*Primary Examiner* — Kenneth B Lee, Jr.
(74) *Attorney, Agent, or Firm* — Blakely Sokoloff Taylor & Zafman LLP

(57) ABSTRACT

The embodiments of the present invention provide an organic electroluminescent display device, a driving method thereof and a display device. Due to the regular staggered arrangement of sub pixels with the same color on the basal substrate, during the manufacture of a metal mask plate, the distance between adjacent openings corresponding to the sub pixels with the same color in the metal mask plate can be relatively large, improving the strength of the metal mask plate; this is beneficial for manufacturing small-sized sub pixels, thereby further improving the resolution of the organic electroluminescent display device.

17 Claims, 16 Drawing Sheets

(51) Int. Cl.
  *G09G 3/20* (2006.01)
  *H01L 51/00* (2006.01)
  *H01L 27/32* (2006.01)

(52) U.S. Cl.
  CPC ...... *H01L 27/3216* (2013.01); *H01L 27/3218* (2013.01); *H01L 51/0011* (2013.01); *G09G 2300/0452* (2013.01); *G09G 2300/0465* (2013.01)

(56) References Cited

U.S. PATENT DOCUMENTS

| | | |
|---|---|---|
| 2012/0092238 A1 | 4/2012 | Hwang et al. |
| 2013/0002118 A1 | 1/2013 | Ko |
| 2014/0198479 A1 | 7/2014 | Chao et al. |
| 2015/0379916 A1 | 12/2015 | Guo et al. |

FOREIGN PATENT DOCUMENTS

| | | |
|---|---|---|
| CN | 201638818 | 11/2010 |
| CN | 103151018 | 6/2013 |
| CN | 103208507 | 7/2013 |
| CN | 103777393 | 5/2014 |
| CN | 103777393 A | 5/2014 |
| CN | 104319283 | 1/2015 |
| KR | 20130007309 | 1/2013 |

OTHER PUBLICATIONS

Chinese Office Action with English Language Translation, dated Jul. 15, 2015, Chinese Application No. 2014105844355.
Chinese Office Action with English Language Translation, dated Nov. 17, 2015, Chinese Application No. 2014105844355.
Office Action in Korean Application No. 10-2016-7005954 dated Jul. 12, 2017, with English translation.

\* cited by examiner

ORGANIC ELECTROLUMINESCENT DISPLAY DEVICE, DRIVING METHOD THEREOF

FIELD OF THE INVENTION

The present invention relates to the technical field of display, in particular to an organic electroluminescent display device, a driving method thereof and a display device.

BACKGROUND OF THE INVENTION

Organic light emitting diode (OLED) is one of the hot spots in the research of flat panel display today. Compared with liquid crystal display, the OLED display device has the advantages of low energy consumption, low production cost, self luminous, wide viewing angle, quick response and so on. At present, in the flat panel display field of mobile phone, PDA, digital cameras and so on, OLED display device has begun to replace the traditional liquid crystal display (LCD).

The structure of an OLED display device mainly comprises: a basal substrate, and pixels arranged in a matrix formed on the basal substrate. Wherein the pixels are organic electroluminescent structures typically formed at corresponding pixel positions in an array substrate with organic material, by applying evaporation film technology through a high precision metal mask plate. In order to perform color display, an OLED display should be colorized. The best color image effect can be achieved with a side-by-side arrangement. The side-by-side arrangement refers to three sub pixels of red, green, blue (G, R, B) arranged in a range of one pixel, each sub pixel has a separate organic electroluminescent structure. due to the difference in the organic electroluminescent materials of red, green and blue sub pixels, in the production process, a metal mask plate is required for evaporation of three different organic electroluminescent materials for the red, green and blue sub-pixels (of three primary colors) at corresponding positions, and then adjust the color blending of these three colors, realizing true color.

The key point for manufacturing OLED display device with high resolution (PPI) is high precise metal mask plate, which is precise and has a good mechanical stability; while the key point for high precise metal mask plate lies in the arrangement of pixels and sub pixels.

Currently, in an existing OLED display device, the arrangement of the pixel array is typically a side-by-side arrangement. As shown in FIG. 1, the OLED display device comprises a basal substrate 1, and pixel units 2 arranged in an array on the basal substrate 1; a pixel unit 2 comprises three parallel sub pixels of red (R), green (G), and blue (B). In order to form the arrangement of the pixel, a corresponding metal mask plate is shown in FIG. 2. FIG. 2 schematically shows a metal mask plate used for forming a sub pixel (R sub pixel) in the pixel arrangement shown in FIG. 1. Since the patterns of the sub pixels are the same, a metal mask plate with the same structure can be used to form other sub pixels (B).

In FIG. 2, a metal mask plate comprises a metal substrate 3 and rectangular openings 4 on the metal substrate 3. Since the sub pixels in a same column in the display device share a same opening, the length of the opening 4 in the metal mask plate is long. For low resolution display device, since the number of pixels is small, the width of the metal strip between adjacent openings 4 on the metal mask plate is wide; therefore the production, application and management of such metal mask plates is simple. However, with the increase of the display resolution, the width of the metal strip between adjacent openings in the metal mask plate is smaller, which causes that the metal strip between adjacent openings in the metal mask plate is easily deformed by external influence during the using process, resulting in color mixing due to the cross contamination of the organic electroluminescent materials with different colors in the sub pixels, causing a low yield rate of the product.

In view of the above problems, a metal mask plate shown in FIG. 3 is proposed, to form a pixel arrangement as shown in FIG. 1. As shown in FIG. 3, the metal mask plate is provided by adding metal lapping bridges 5 at positions between adjacent sub pixels shown in FIG. 1 to the metal mask plate as shown in FIG. 2, to connect adjacent metal strips, modifying a opening 4 shown in FIG. 2 into openings 6 corresponding to the sub pixels shown in FIG. 1. Although the method can make the shape of the metal strips in the metal mask plate more stable, in order to avoid masking effect of the metal lapping bridges to the sub pixels, a sufficient distance should be kept between the sub pixels and the metal lapping bridges, which can reduce the size of the sub pixels, thus affecting the opening rate of the OLED display device.

SUMMARY OF THE INVENTION

To this end, the embodiments of the present invention provide an organic electroluminescent display device, a driving method thereof and a display device, to provide an organic electroluminescent display device with a new pixel arrangement, achieving a metal mask plate with simple manufacture and high mechanical stability, thereby improving the production efficiency of high resolution organic electroluminescent display device, reducing production costs.

Therefore, an embodiment of the present invention provides an organic electroluminescent display device; the organic electroluminescent display device comprises a basal substrate and several pixel unit groups arranged in a matrix on the basal substrate; each of the pixel unit groups comprises a first pixel unit subgroup and a second pixel unit subgroup; the first pixel unit subgroup and the second pixel unit subgroup are arranged along a first direction adjacent to each other, and comprise sub pixels with three different colors respectively; wherein, the first pixel unit subgroup comprises a sub pixel sequence in an order of a first sub pixel, a second sub pixel and a third sub pixel along a second direction;

the second pixel unit subgroup comprises a sub pixel sequence in an order of the third sub pixel, the first sub pixel and the second sub pixel along the second direction;

in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal.

Preferably, in the organic electroluminescent display device provided by the embodiment of the present invention, in the same pixel unit subgroup, the distance between centers of two adjacent sub pixels is constant.

Preferably, in the organic electroluminescent display device provided by the embodiment of the present invention, the sub pixels with the same color have the same size.

Preferably, in the organic electroluminescent display device provided by the embodiment of the present invention, the first direction is perpendicular to the second direction.

Preferably, to improve the resolution, in the same pixel unit group, the component of the distance between centers of two adjacent sub pixels with the same color respectively located in the first pixel unit subgroup and the second pixel unit subgroup in the first direction is equal to or less than ¾ of the component thereof in the second direction.

Preferably, in the organic electroluminescent display device provided by the embodiment of the present invention, the first sub pixel, the second sub pixel and the third sub pixel are selected from a group comprising red sub pixel, green sub pixel and blue sub pixel.

Preferably, in order to reduce the production quantity of the metal mask plate, in the organic electroluminescent display device provided by the embodiment of the present invention, in the same pixel unit group, all the sub pixels have the same size.

Preferably, in order to prolong the lifetime of the organic electroluminescent display device, in the organic electroluminescent display device provided by the embodiment of the present invention, in the same pixel unit group, the size of the red sub pixel is same with the size of the green sub pixel; the size of the blue sub pixel is larger than the size of the red sub pixel.

Preferably, in order to facilitate the arrangement of contact holes connecting each sub pixel and the corresponding pixel circuit on the basal substrate, in the organic electroluminescent display device provided by the embodiment of the present invention, the size of the third sub pixel is smaller than the size of the first sub pixel and the size of the second sub pixel respectively.

Further, to ensure the resolution of the organic electroluminescent display device, and in order to facilitate the arrangement of contact holes connecting each sub pixel and the corresponding pixel circuit on the basal substrate, in the organic electroluminescent display device provided by the embodiment of the present invention, in the same pixel unit group:

the component of the distance between centers of two adjacent third sub pixels respectively located in the first pixel unit subgroup and the second pixel unit subgroup in the first direction is less than ¾ of the component thereof in the second direction;

the component of the distance between centers of two adjacent first sub pixels respectively located in the first pixel unit subgroup and the second pixel unit subgroup in the first direction is equal to ¾ of the component thereof in the second direction;

the component of the distance between centers of two adjacent second sub pixels respectively located in the first pixel unit subgroup and the second pixel unit subgroup in the first direction is equal to ¾ of the component thereof in the second direction.

Particularly, in order to facilitate the arrangement of contact holes connecting each sub pixel and the corresponding pixel circuit on the basal substrate, in the organic electroluminescent display device provided by the embodiment of the present invention, each of the pixel unit groups further comprises contact holes one-to-one corresponding to the sub pixels and pixel circuits, each of the sub pixels being connected to a corresponding pixel circuit through a corresponding contact hole; wherein, in the first pixel unit subgroup, a first contact hole is located between the first sub pixel and the second sub pixel, a second contact hole and a third contact hole are respectively located on both sides of the third sub pixel in the first direction;

in the second pixel unit subgroup, a fourth contact hole is located between the first sub pixel and the second sub pixel, a fifth contact hole and a sixth contact hole are respectively located on both sides of the third sub pixel in the first direction;

the first contact hole, the fifth contact hole and the sixth contact hole are aligned in the first direction; the second contact hole, the third contact hole and the fourth contact hole are aligned in the first direction; the first contact hole and the second contact hole are aligned in the second direction; the fifth contact hole and the third contact hole are aligned in the second direction; the sixth contact hole and the fourth contact hole are aligned in the second direction. In such a manner, the contact holes on the basal substrate are arranged in a matrix, thereby reducing the difficulty of back board wiring in the organic electroluminescent display device.

Preferably, in order to ensure the display effect of the organic electroluminescent display device, in the organic electroluminescent display device provided by the embodiment of the present invention, the third sub pixel is a green sub pixel.

Preferably, in order to ensure a good aperture ratio for the organic electroluminescent display device, in the organic electroluminescent display device provided by the embodiment of the present invention, the third sub pixel comprises a first portion extending along the second direction, and an extending part extending along the first direction from the first portion;

in the first pixel unit subgroup, the second contact hole and the third contact hole are respectively located on both sides of the first part of the third sub pixel; and the extending part of the third sub pixel is at least located on a side of the second contact hole;

in the second pixel unit subgroup, the fifth contact hole and the sixth contact hole are respectively located on both sides of the first part of the third sub pixel; and the extending part of the third sub pixel is at least located on a side of the sixth contact hole.

Preferably, in order to reduce the production quantity of the metal mask plate, in the organic electroluminescent display device provided by the embodiment of the present invention, the size of the blue sub pixel is larger than the size of the red sub pixel.

Preferably, in order to ensure the lifetime of the organic electroluminescent display device, in the organic electroluminescent display device provided by the embodiment of the present invention, the size of the blue sub pixel is equal to the size of the red sub pixel.

Preferably, in order to facilitate the implementation, in the organic electroluminescent display device provided by the embodiment of the present invention, the shape of each sub pixel is rectangle.

Accordingly, an embodiment of the present invention provides a driving method for any one of the above mentioned organic electroluminescent display devices, wherein the driving method comprises: in the same pixel unit group, the first pixel unit subgroup and the second pixel unit subgroup share at least one sub pixel.

Accordingly, an embodiment of the present invention provides a display device, wherein the display device comprises any one of the above mentioned organic electroluminescent display devices.

According to the organic electroluminescent display device, the driving method thereof and the display device provided by the embodiments of the present invention, each of the pixel unit groups comprises a first pixel unit subgroup and a second pixel unit subgroup; the first pixel unit subgroup and the second pixel unit subgroup are arranged along a first direction adjacent to each other, and comprise sub pixels with three different colors respectively; wherein the first pixel unit subgroup comprises a sub pixel sequence in an order of a first sub pixel, a second sub pixel and a third sub pixel along a second direction; the second pixel unit subgroup comprises a sub pixel sequence in an order of the third sub pixel, the first sub pixel and the second sub pixel along the second direction; in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal. In such a manner, the regular staggered arrangement of sub pixels with the same color on the basal substrate can be ensured. During the manufacture of a corresponding metal mask plate, the distance between adjacent openings corresponding to the sub pixels with the same color in the metal mask plate can be relatively large, improving the strength of the metal mask plate; this is beneficial for manufacturing small-sized sub pixels, thereby further improving the resolution of the organic electroluminescent display device.

DETAILED DESCRIPTION OF THE INVENTION

Figure 1:
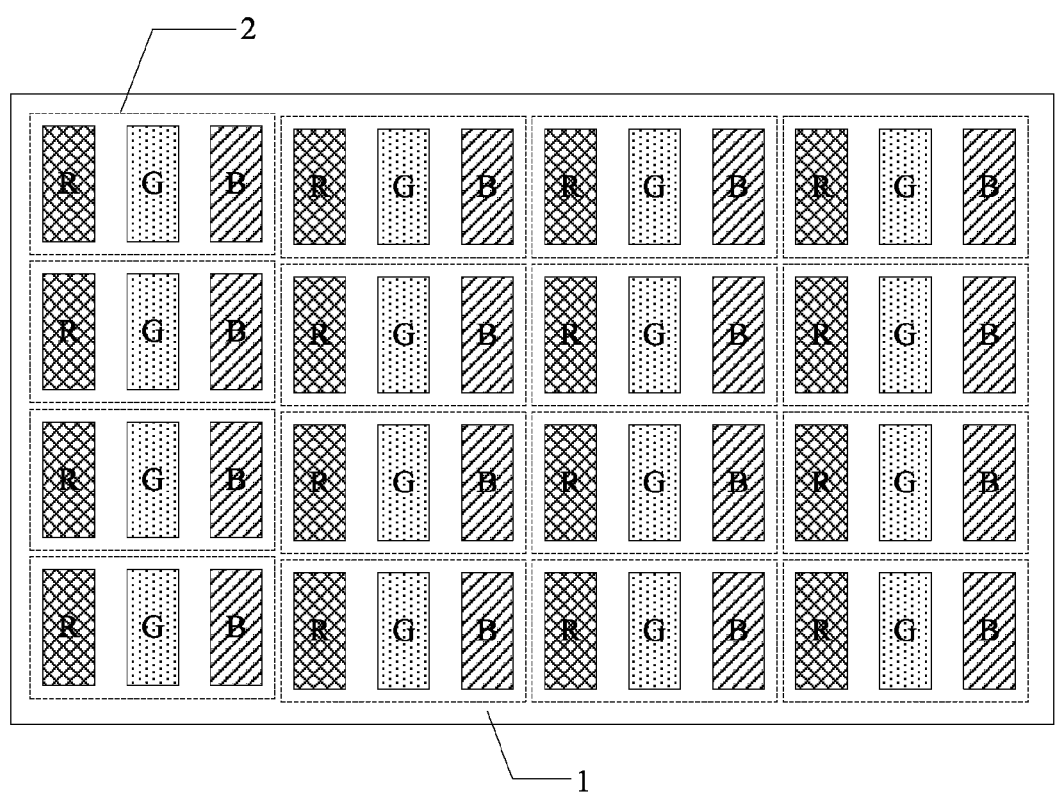
FIG. 1 is a structural schematic diagram of a pixel arrangement in an existing organic electroluminescent display device.
Figure 2:
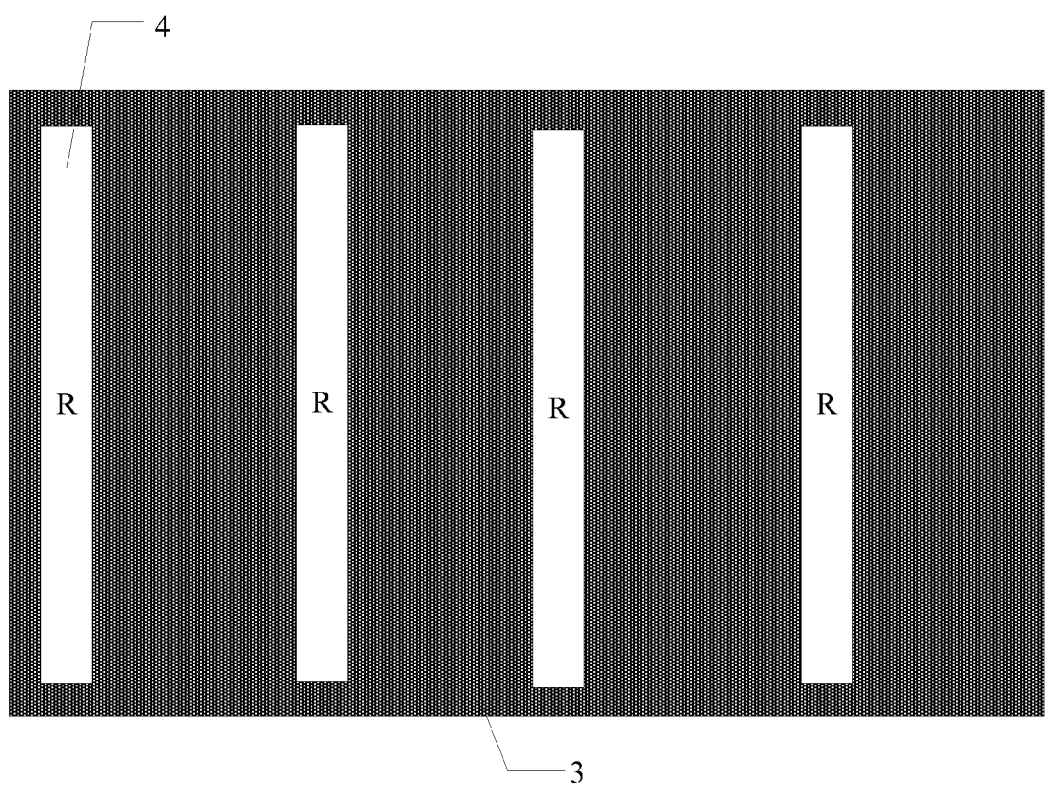
FIG. 2 shows a metal mask plate used for manufacturing an organic electroluminescent display device shown in FIG. 1.
Figure 3:
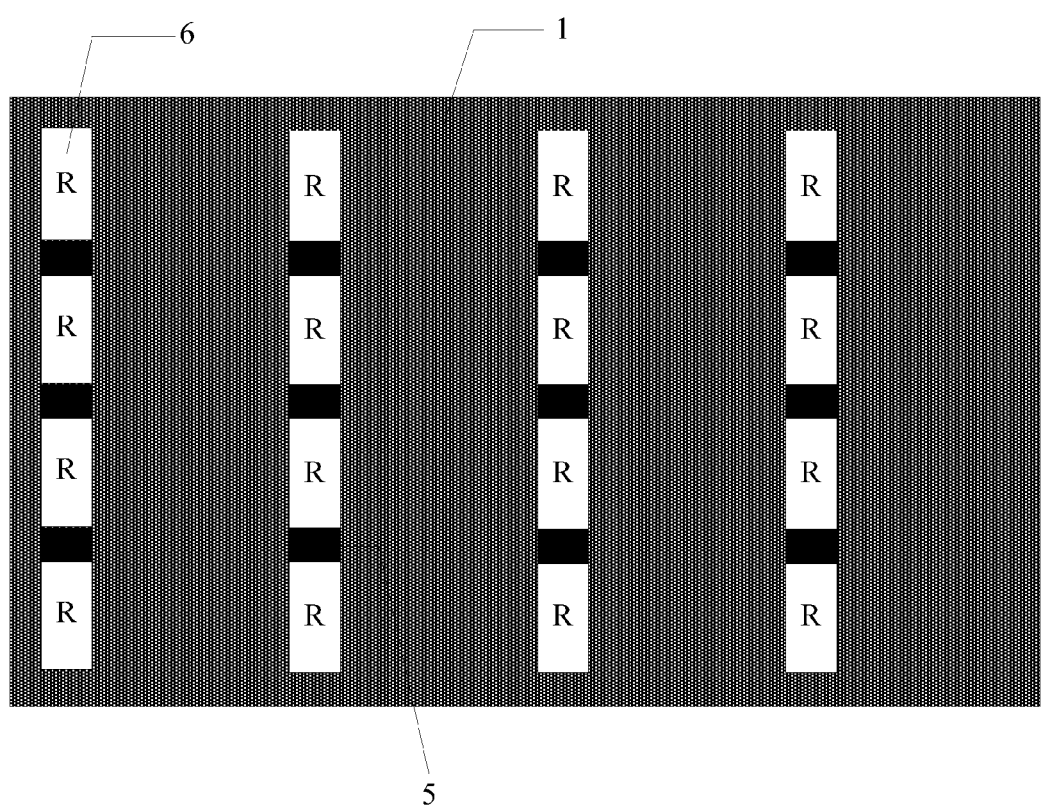
FIG. 3 shows another metal mask plate used for manufacturing an organic electroluminescent display device shown in FIG. 1.

In the following, the implementations of the organic electroluminescent display device, the driving method thereof and the display device provided by the embodiments of the invention will be described clearly and completely in connection with the drawings.

The shapes and thickness of the film layer in the drawings do not reflect the real scale of the organic electroluminescent display device, but to schematically illustrate the content of the invention.

Figure 4:
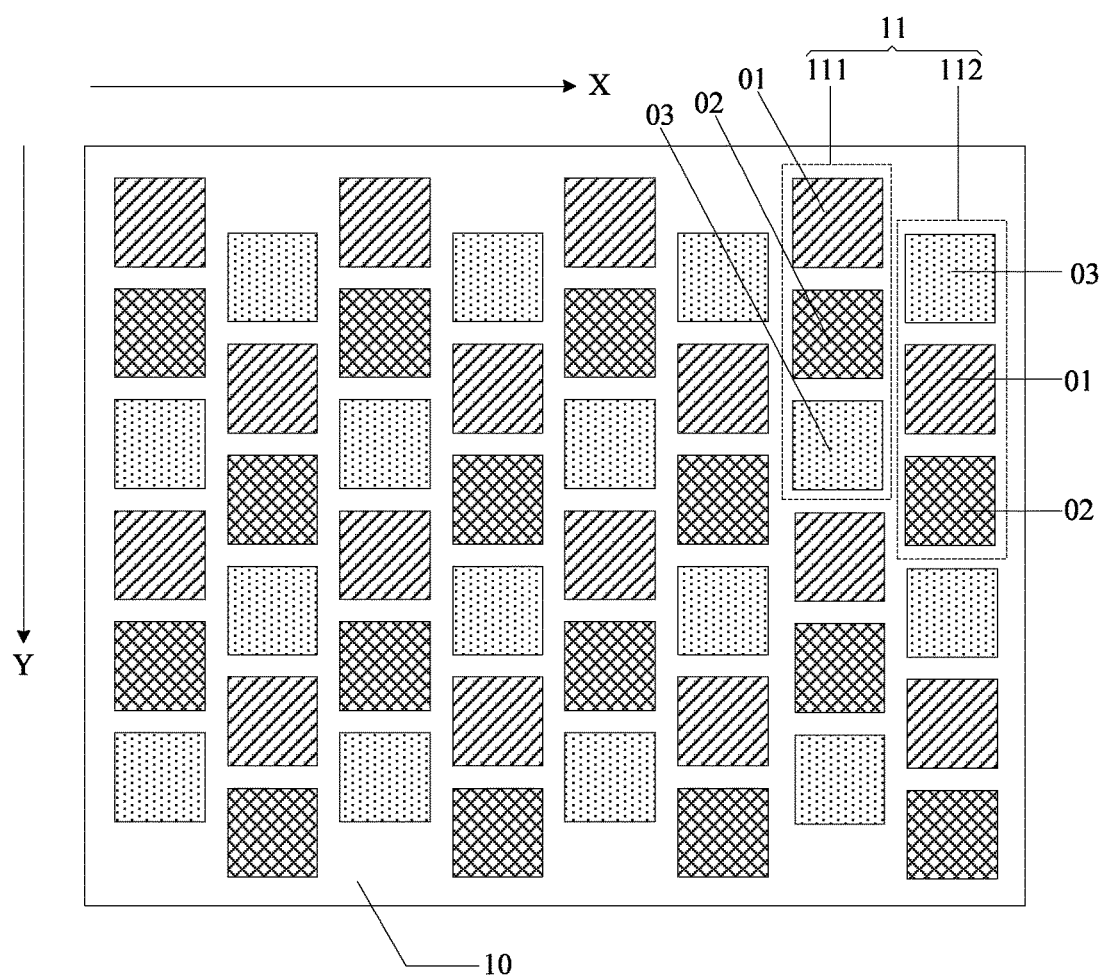
FIG. 4 is a first structural schematic diagram of an organic electroluminescent display device provided by an embodiment of the present invention.
Figure 5:
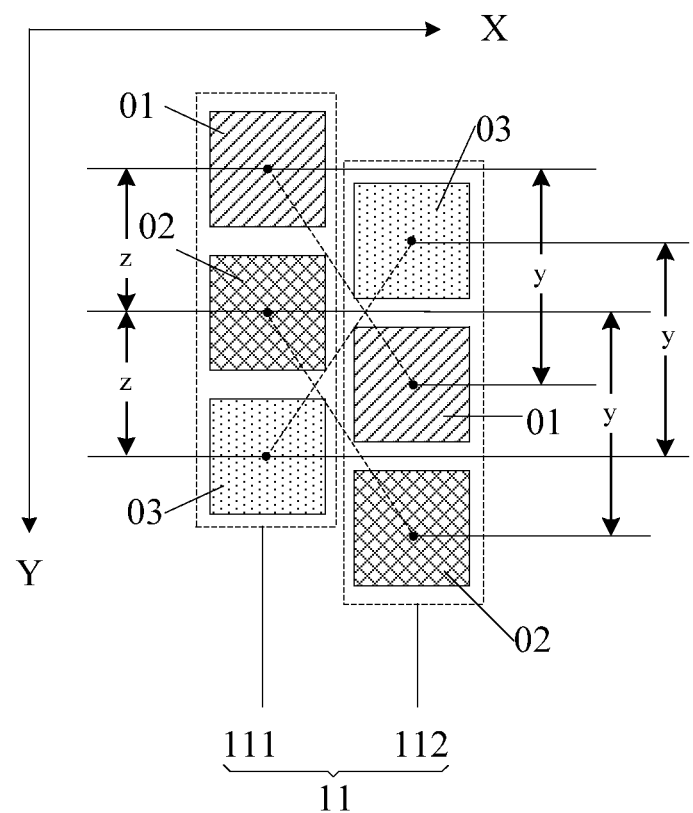
FIG. 5 is a first structural schematic diagram of a pixel unit group in the organic electroluminescent display device provided by an embodiment of the present invention.

An embodiment of the present invention provides an organic electroluminescent display device; as shown in FIG. 4, the organic electroluminescent display device comprises a basal substrate 10 and several pixel unit groups 11 arranged in a matrix on the basal substrate 10 (wherein a structural schematic diagram of a pixel unit group is shown in FIG. 5); each of the pixel unit groups 11 comprises a first pixel unit subgroup 111 and a second pixel unit subgroup 112; the first pixel unit subgroup 111 and the second pixel unit subgroup 112 are arranged along a first direction X adjacent to each other, and comprise sub pixels with three different colors respectively; wherein, the first pixel unit subgroup 111 comprises a sub pixel sequence in an order of a first sub pixel 01, a second sub pixel 02 and a third sub pixel 03 along a second direction Y;

the second pixel unit subgroup 112 comprises a sub pixel sequence in an order of the third sub pixel 03, the first sub pixel 01 and the second sub pixel 02 along the second direction;

in the same pixel unit group 11, the component y of the distance between centers of two adjacent first sub pixels 01 respectively located in the first pixel unit subgroup 111 and the second pixel unit subgroup 112 in the second direction Y, the component y of the distance between centers of two adjacent second sub pixels 02 respectively located in the first pixel unit subgroup 111 and the second pixel unit subgroup 112 in the second direction Y, and the component y of the distance between centers of two adjacent third sub pixels 03 respectively located in the first pixel unit subgroup 111 and the second pixel unit subgroup 112 in the second direction Y, are all equal.

Figure 6:
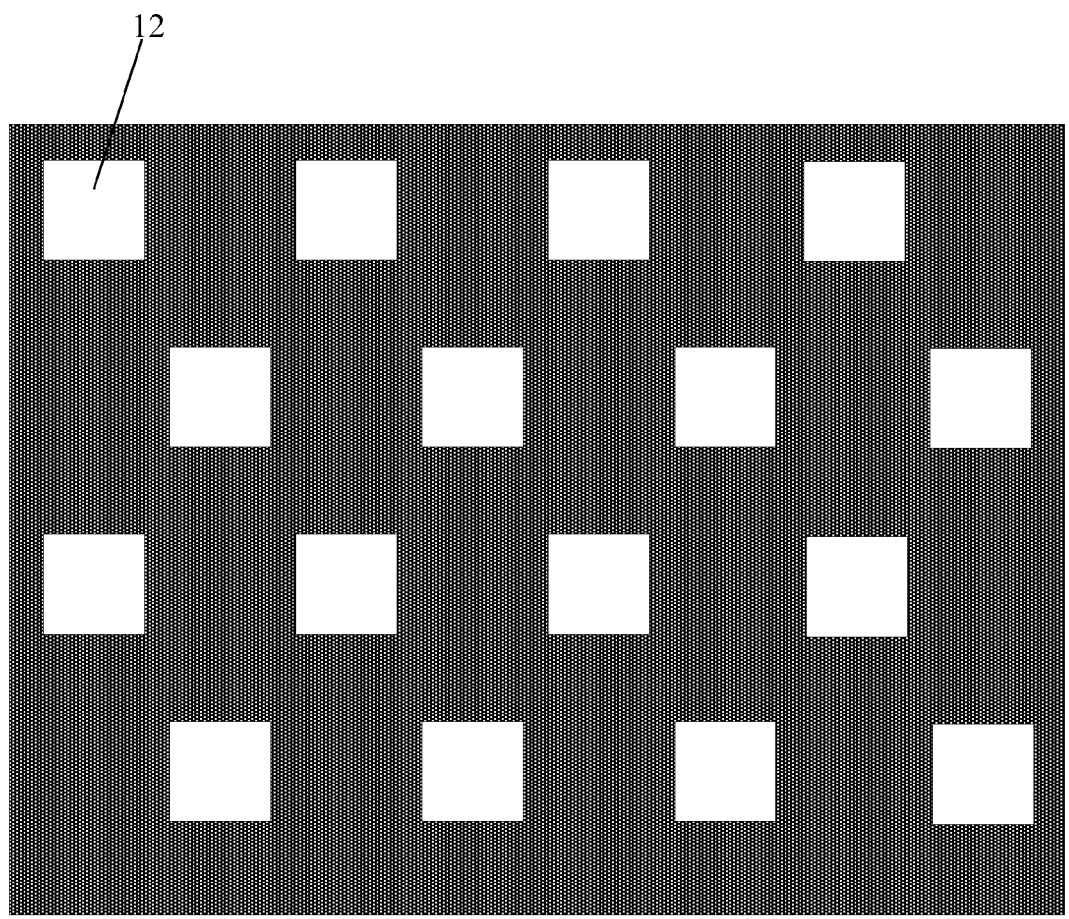
FIG. 6 shows a metal mask plate used for manufacturing an organic electroluminescent display device shown in FIG. 4.

In the organic electroluminescent display device provided by the embodiment of the present invention, each of the pixel unit groups comprises a first pixel unit subgroup and a second pixel unit subgroup; the first pixel unit subgroup and the second pixel unit subgroup are arranged along a first direction adjacent to each other, and comprise sub pixels with three different colors respectively; wherein the first pixel unit subgroup comprises a sub pixel sequence in an order of a first sub pixel, a second sub pixel and a third sub pixel along a second direction; the second pixel unit subgroup comprises a sub pixel sequence in an order of the third sub pixel, the first sub pixel and the second sub pixel along the second direction; in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal. In such a manner, the regular staggered arrangement of sub pixels with the same color on the basal substrate can be ensured. During the manufacture of a corresponding metal mask plate, as shown in FIG. 6 (which shows a schematic diagram of the openings in a metal mask plate corresponding to the sub pixels with the same color), the distance between adjacent openings 12 corresponding to the sub pixels with the same color in the metal mask plate can be relatively large, and the distance between adjacent openings 12 corresponding to the sub pixels with different colors in the metal mask plate can be relatively uniform, improving the strength of the metal mask plate; this is beneficial for manufacturing small-sized sub pixels, thereby further improving the resolution of the organic electroluminescent display device.

Preferably, in the organic electroluminescent display device provided by the embodiment of the present invention, as shown in FIG. 5, in the same pixel unit subgroup, the distance between centers of two adjacent sub pixels is constant, i.e., the components z in the second direction Y are the same.

Preferably, in the organic electroluminescent display device provided by the embodiment of the present invention, as shown in FIG. 5, the sub pixels with the same color have the same size. Since the sub pixels with the same color have the same size, the difficulty of manufacturing the metal mask plate can be further reduced.

Preferably, in the organic electroluminescent display device provided by the embodiment of the present invention, the first direction is perpendicular to the second direction. In the embodiments of the present invention, the examples are all illustrated with the first direction being perpendicular to the second direction.

Particularly, in an implementation, the row direction or the column direction of the organic electroluminescent display device can be selected as the first direction; the column direction or the row direction of the organic electroluminescent display device can be selected as the second direction.

Figure 7:
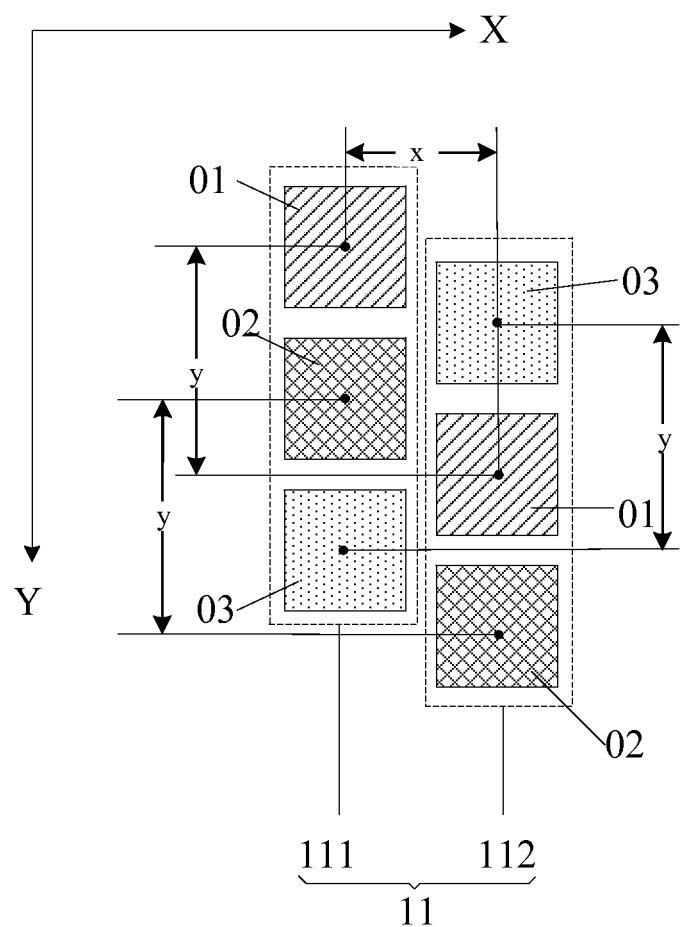
FIG. 7 is a second structural schematic diagram of another pixel unit group in the organic electroluminescent display device provided by an embodiment of the present invention.

Preferably, in the organic electroluminescent display device provided by the embodiment of the present invention, as shown in FIG. 7, in the same pixel unit group, the component x of the distance between centers of two adjacent sub pixels with the same color respectively located in the first pixel unit subgroup 111 and the second pixel unit subgroup 112 in the first direction is equal to or less than ¾ of the component y thereof in the second direction. By reducing the width of each pixel unit group in the first direction, the number of pixel unit groups on the display device can be increased, thereby improving the pixel resolution. Further, in the same pixel unit group, the first pixel unit subgroup and the second pixel unit subgroup share sub pixel(s) (e.g., any two adjacent sub pixels in the first pixel unit subgroup share a sub pixel in the second pixel unit subgroup with a different color from those of the two adjacent sub pixels; any two adjacent sub pixels in the second pixel unit subgroup share a sub pixel in the first pixel unit subgroup with a different color from those of the two adjacent sub pixels), thereby improving the virtual display resolution of the screen. For example, when the original number of pixels is N, N is an integer equal to or greater than 2, the number of pixels can be increased to 3N/2 when the method of sharing sub pixels in the same pixel unit group is applied in the organic electroluminescent display device of the present invention.

Preferably, in the organic electroluminescent display device provided by the embodiment of the present invention, the first sub pixel, the second sub pixel and the third sub pixel are selected from a group comprising red (R) sub pixel, green (G) sub pixel and blue (B) sub pixel. In the embodiments of the present invention, the first sub pixel can be one of a red (R) sub pixel, green (G) sub pixel and blue (B) sub pixel, the second sub pixel can be one of a red (R) sub pixel, green (G) sub pixel and blue (B) sub pixel, the first sub pixel can be one of a red (R) sub pixel, green (G) sub pixel and blue (B) sub pixel; moreover, the colors of the first sub pixel, the second sub pixel and the third sub pixel are all different.

Further, in order to reduce the production quantity of the metal mask plate, in the organic electroluminescent display device provided by the embodiment of the present invention, in the same pixel unit group, all the sub pixels have the same size. In such a manner, in the organic electroluminescent display device, the arrangement of the sub pixels with the same color presents the same regularity; moreover, the size of the pixels are the same, i.e., the regularities for the arrangements of the three types of the sub pixels with different colors are the same. Therefore, the same one metal mask plate can be used during the manufacture of the sub pixels with different colors, thereby reducing the production quantity of the metal mask plate.

Figure 8:
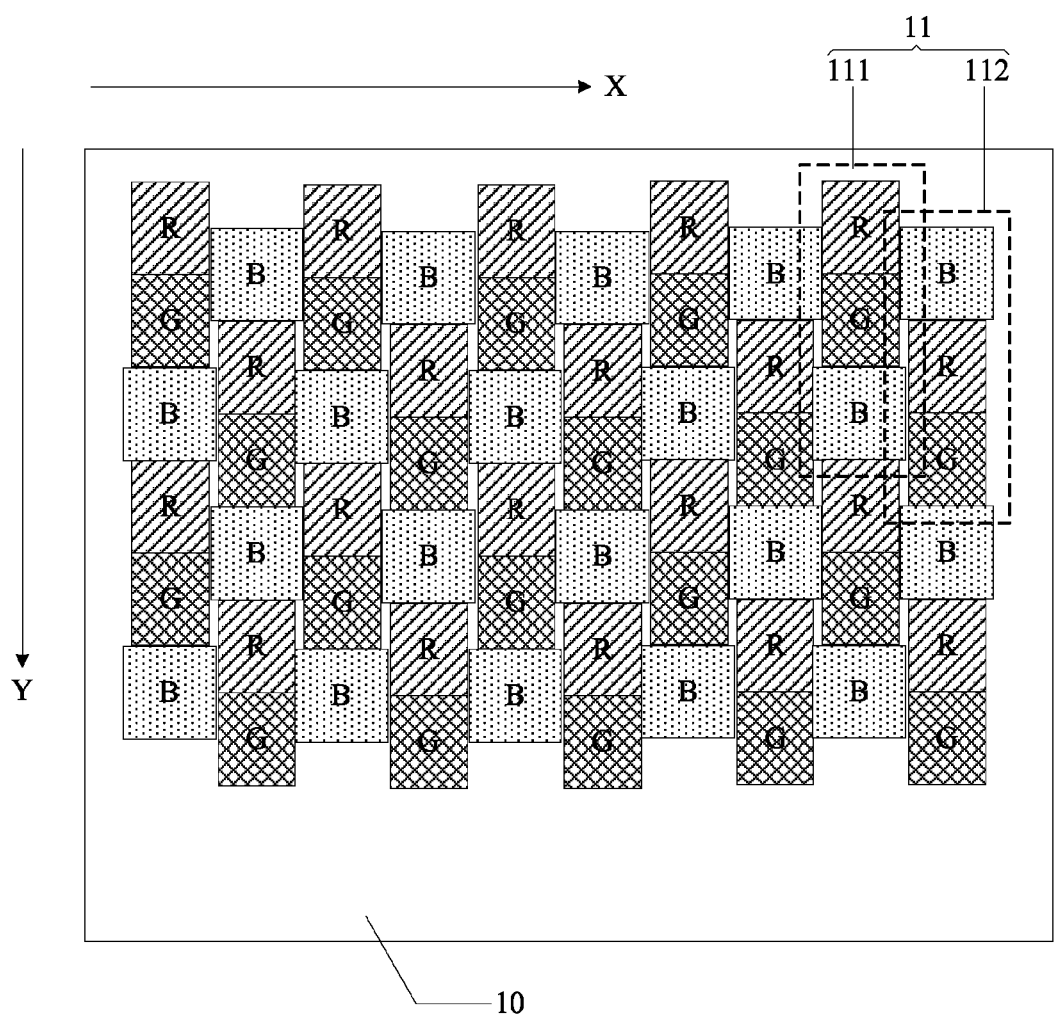
FIG. 8 is a second structural schematic diagram of an organic electroluminescent display device provided by an embodiment of the present invention.

Preferably, in order to prolong the lifetime of the organic electroluminescent display device, in the organic electroluminescent display device provided by the embodiment of the present invention, as shown in FIG. 8, in the same pixel unit group, the size of the red (R) sub pixel is same with the size of the green (G) sub pixel; the size of the blue (B) sub pixel is larger than the size of the red (R) sub pixel. Since the lifetime of the blue luminescent material for manufacturing the blue (B) sub pixel is generally the lowest, the lifetime of the organic electroluminescent display device mainly depends on that of the blue (B) sub pixel. To achieve the same display brightness, the brightness of the blue (B) sub pixel can be reduced when size of the blue (B) sub pixel is increased. By decreasing the current density flowing through the blue (B) sub pixels, the lifetime of the blue sub pixels can be prolonged, thereby prolonging the lifetime of the organic electroluminescent display device.

Particularly, to enable the light emitting of the sub pixels in the organic electroluminescent display device, pixel circuits are required for driving the sub pixels to emit light. The pixel circuit is generally located below the light emitting layer, and the pixel circuit is electrically connected with the anode of the corresponding sub pixel through a contact hole on a planarization layer over the pixel circuit.

Figure 9:
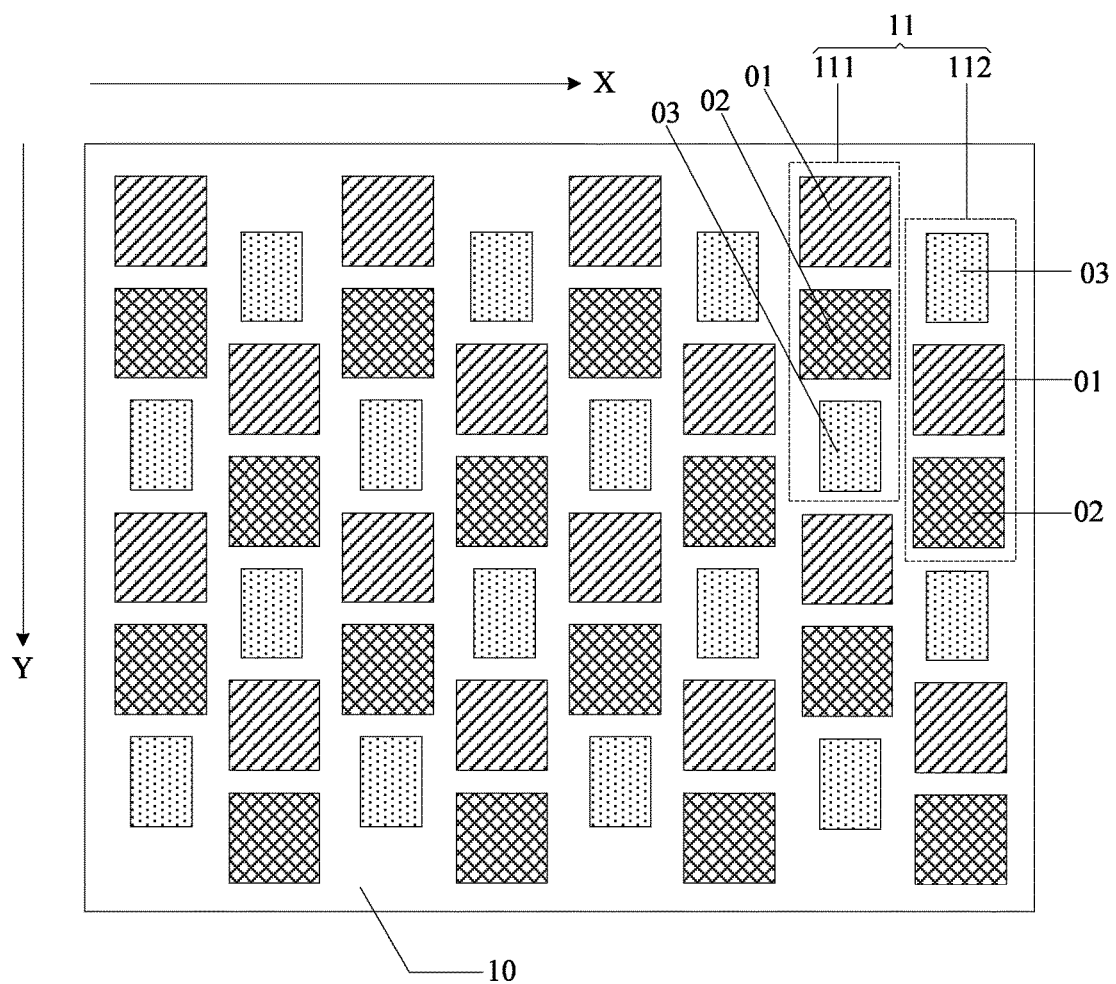
FIG. 9 is a third structural schematic diagram of an organic electroluminescent display device provided by an embodiment of the present invention.
Figure 10:
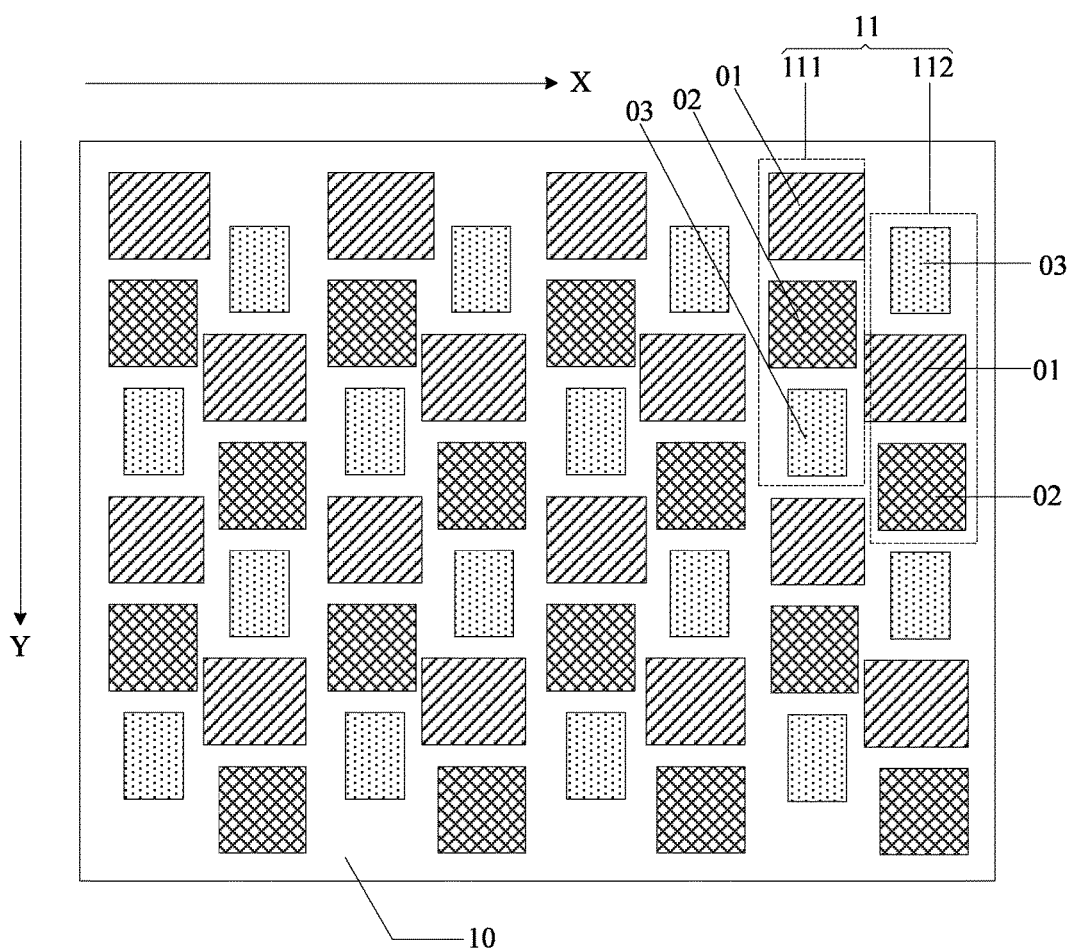
FIG. 10 is a fourth structural schematic diagram of an organic electroluminescent display device provided by an embodiment of the present invention.

Therefore, preferably, in the organic electroluminescent display device provided by the embodiment of the present invention, as shown in FIG. 9 and FIG. 10, the size of the third sub pixel 03 is smaller than the size of the first sub pixel 01 and the size of the second sub pixel 02 respectively. Since the third sub pixel 03 is the smallest, contact holes can be arranged on both sides of the third sub pixel 03.

Figure 11:
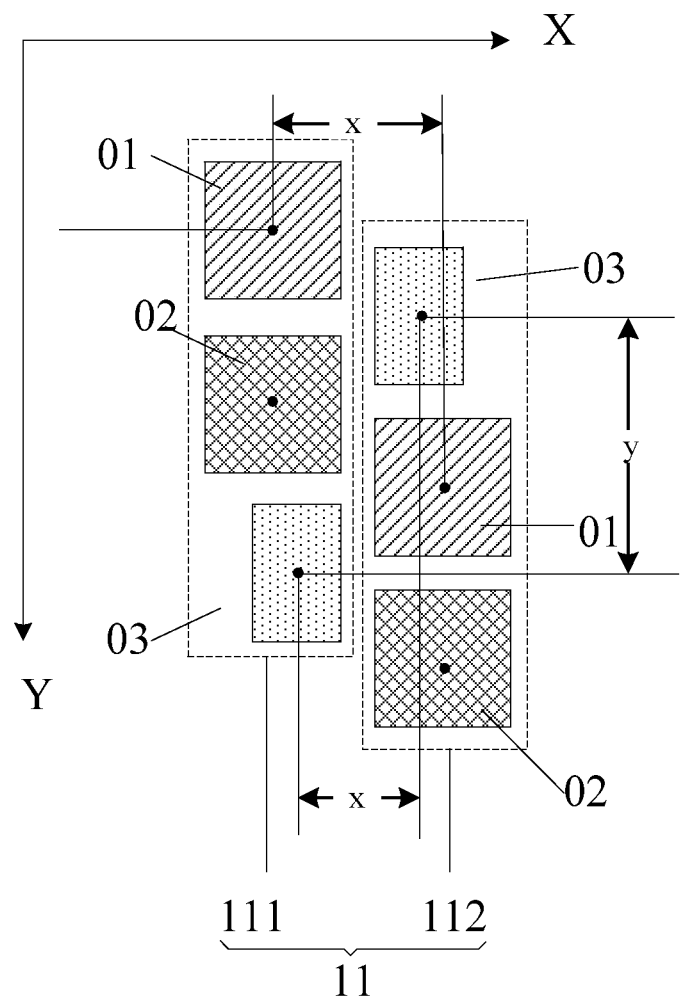
FIG. 11 is a third structural schematic diagram of another pixel unit group in the organic electroluminescent display device provided by an embodiment of the present invention.

Further, in order to facilitate the manufacture of contact holes connecting each sub pixel and the corresponding pixel circuit on the basal substrate, in the organic electroluminescent display device provided by the embodiment of the present invention, as shown in FIG. 11, in the same pixel unit group 11:

the component x of the distance between centers of two adjacent third sub pixels 03 respectively located in the first pixel unit subgroup 111 and the second pixel unit subgroup 112 in the first direction X is less than ¾ of the component x thereof in the second direction;

the component of the distance between centers of two adjacent first sub pixels 01 respectively located in the first pixel unit subgroup 111 and the second pixel unit subgroup 112 in the first direction X is equal to ¾ of the component y thereof in the second direction;

the component of the distance between centers of two adjacent second sub pixels 02 respectively located in the first pixel unit subgroup 111 and the second pixel unit subgroup 112 in the first direction X is equal to ¾ of the component y thereof in the second direction.

Figure 12:
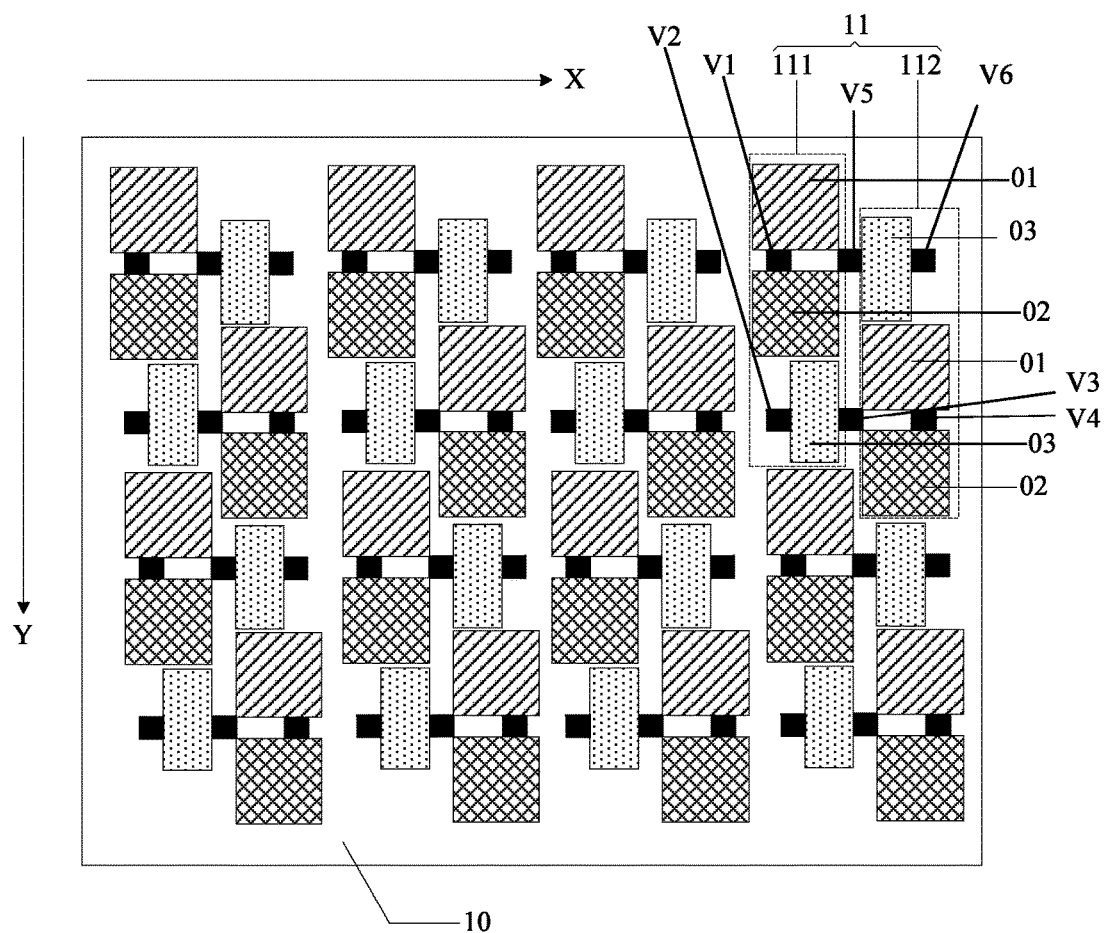
FIG. 12 is a fifth structural schematic diagram of an organic electroluminescent display device provided by an embodiment of the present invention.

Particularly, in the organic electroluminescent display device provided by the embodiment of the present invention, as shown in FIG. 12, each of the pixel unit groups 11 further comprises contact holes one-to-one corresponding to the sub pixels and pixel circuits (not shown in FIG. 12), each of the sub pixels being connected to a corresponding pixel circuit through a corresponding contact hole; wherein, in the first pixel unit subgroup 111, a first contact hole V1 is located between the first sub pixel 01 and the second sub pixel 02, a second contact hole V2 and a third contact hole V3 are respectively located on both sides of the third sub pixel 03 in the first direction X;

in the second pixel unit subgroup 112, a fourth contact hole V4 is located between the first sub pixel 01 and the second sub pixel 02, a fifth contact hole V5 and a sixth contact hole V6 are respectively located on both sides of the third sub pixel 03 in the first direction X;

the first contact hole V1, the fifth contact hole V5 and the sixth contact hole V6 are aligned in the first direction X; the second contact hole V2, the third contact hole V3 and the fourth contact hole V4 are aligned in the first direction X; the first contact hole V1 and the second contact hole V2 are aligned in the second direction Y; the fifth contact hole V5 and the third contact hole V3 are aligned in the second direction Y; the sixth contact hole V6 and the fourth contact hole V4 are aligned in the second direction Y. In such a manner, the contact holes on the basal substrate are arranged in a matrix, thereby reducing the difficulty of back board wiring in the organic electroluminescent display device.

It should be noted that, in the organic electroluminescent display device provided by the embodiment of the present invention, in each pixel unit group, the first contact hole corresponds to one of two sub pixels adjacent to the first contact hole in the first pixel unit subgroup; the other one of these two sub pixels adjacent to the first contact hole corresponds to the fifth contact hole; the second contact hole corresponds to the third sub pixel in the first pixel unit subgroup; the fourth contact hole corresponds to one of two sub pixels adjacent to the fourth contact hole in the second pixel unit subgroup; the other one of these two sub pixels adjacent to the fourth contact hole corresponds to the third contact hole; the sixth contact hole corresponds to the third sub pixel in the second pixel unit subgroup.

Further, to reduce the difficulty in the manufacture, in the organic electroluminescent display device provided by the embodiment of the present invention, the sizes of the contact holes are the same.

Figure 13:
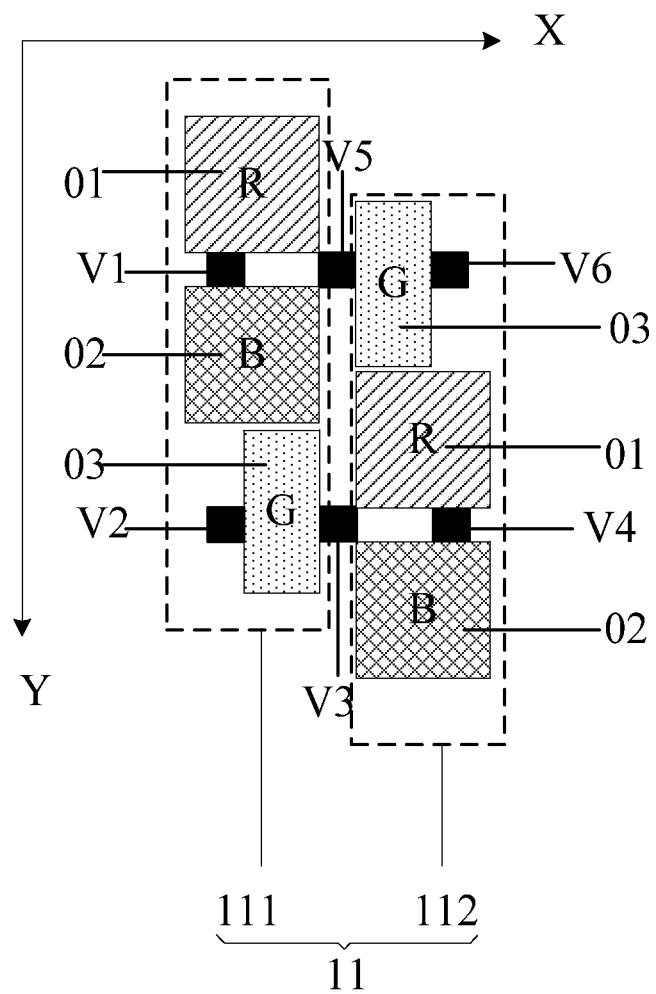
FIG. 13 is a fourth structural schematic diagram of another pixel unit group in the organic electroluminescent display device provided by an embodiment of the present invention.

Preferably, in the organic electroluminescent display device provided by the embodiment of the present invention, as shown in FIG. 13, according to the lifetime and display effect of the sub pixels with different colors, the third sub pixel 03 is a green (G) sub pixel. In this way, the size of the green sub pixel is smaller than the size of the red sub pixel and the size of the blue sub pixel respectively.

Figure 15:
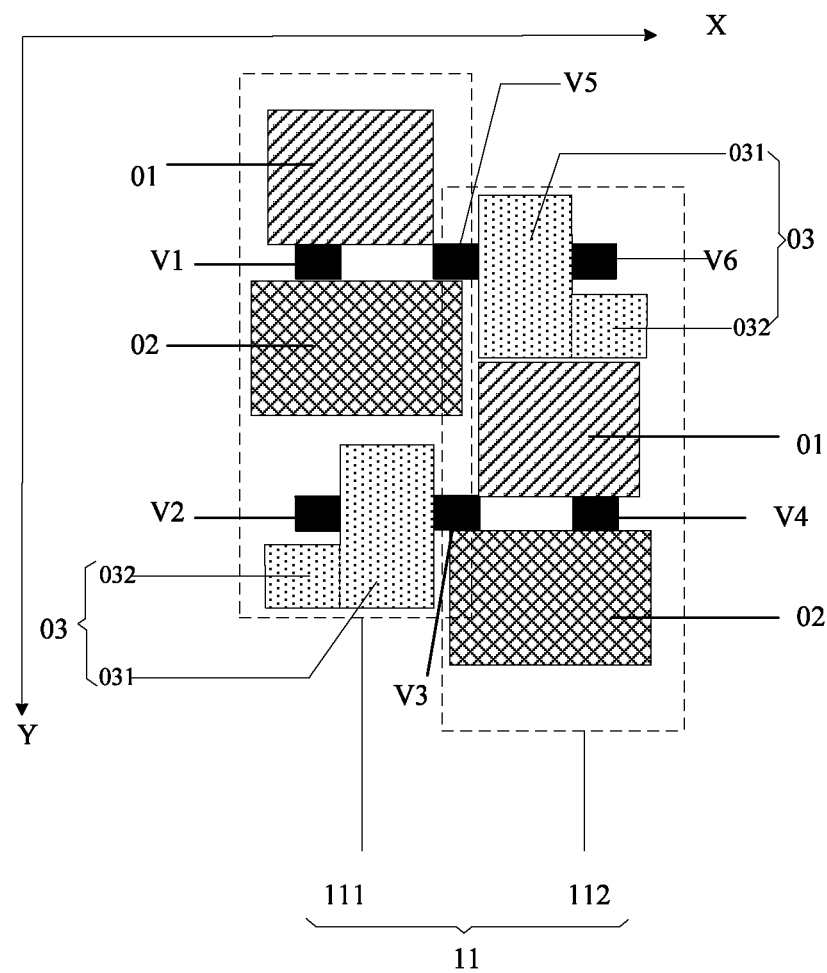
FIG. 15 is a sixth structural schematic diagram of another pixel unit group in the organic electroluminescent display device provided by an embodiment of the present invention.
Figure 16:
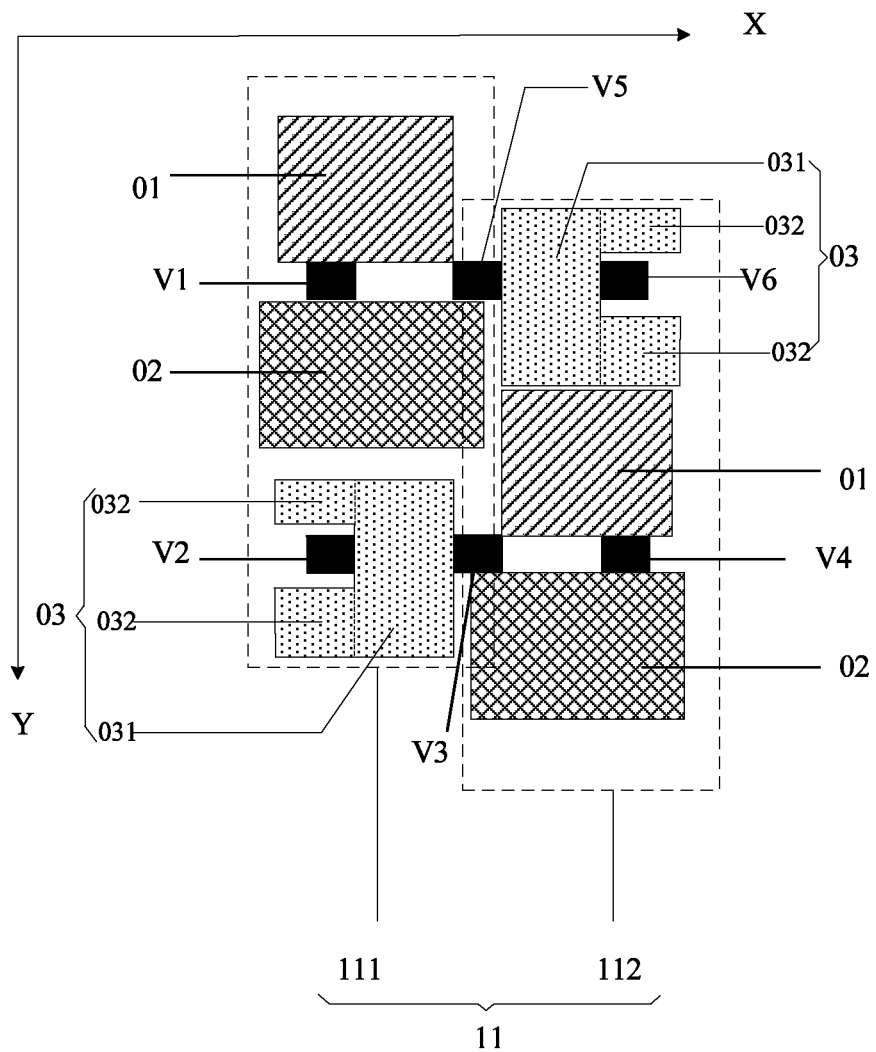
FIG. 16 is a seventh structural schematic diagram of another pixel unit group in the organic electroluminescent display device provided by an embodiment of the present invention.

Further, in order to ensure a good aperture ratio for the organic electroluminescent display device, in the organic electroluminescent display device provided by the embodiment of the present invention, as shown in FIG. 15 and FIG. 16, the third sub pixel 03 comprises a first portion 031 extending along the second direction Y, and an extending part 032 extending along the first direction X from the first portion 031; wherein the wording "along a direction" can also be construed as "substantially parallel to a direction";

in the first pixel unit subgroup 111, the second contact hole V2 and the third contact hole V3 are respectively located on both sides of the first part 031 of the third sub pixel 03; and the extending part 032 of the third sub pixel 03 is at least located on a side of the second contact hole V2;

in the second pixel unit subgroup 112, the fifth contact hole V5 and the sixth contact hole V6 are respectively located on both sides of the first part 031 of the third sub pixel 03; and the extending part 032 of the third sub pixel 03 is at least located on a side of the sixth contact hole V6. In this way, the light emitting area of the third sub pixel can be increased without affecting the arrangement of the contact holes, thereby increasing the aperture ratio for the organic electroluminescent display device.

Preferably, in order to reduce the production quantity of the metal mask plate, in the organic electroluminescent display device provided by the embodiment of the present invention, as shown in FIG. 13, the size of the blue (B) sub pixel is larger than the size of the red (R) sub pixel.

Figure 14:
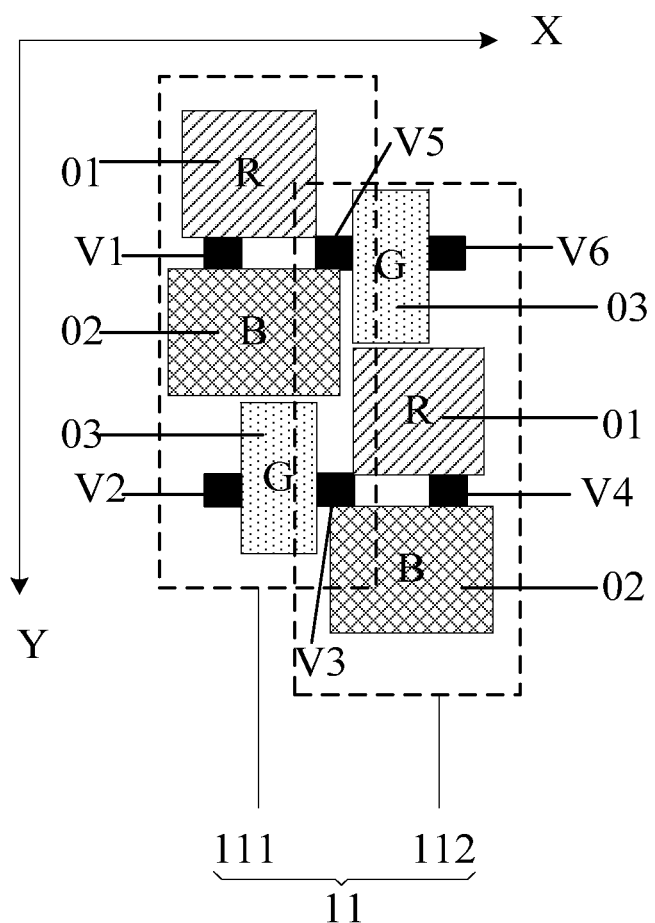
FIG. 14 is a fifth structural schematic diagram of another pixel unit group in the organic electroluminescent display device provided by an embodiment of the present invention.

Or, preferably, in order to ensure the lifetime of the organic electroluminescent display device, in the organic electroluminescent display device provided by the embodiment of the present invention, as shown in FIG. 14, the size of the blue (B) sub pixel is equal to the size of the red (R) sub pixel.

Preferably, in the organic electroluminescent display device provided by the embodiment of the present invention, the shape of each sub pixel is rectangle, which is not limited herein.

Based on the same inventive concept, an embodiment of the present invention provides a driving method for any one of the above mentioned organic electroluminescent display devices, wherein the driving method comprises: in the same pixel unit group, the first pixel unit subgroup and the second pixel unit subgroup share at least one sub pixel. For example, the first sub pixel in the first pixel unit subgroup and the second sub pixel in the second pixel unit subgroup share the third sub pixel in the second pixel unit subgroup; or, the second sub pixel and the third sub pixel in the first pixel unit subgroup share the first sub pixel in the second pixel unit subgroup; or, the first sub pixel and the second sub pixel in the second pixel unit subgroup share the third sub pixel in the first pixel unit subgroup; or, the first sub pixel and the third sub pixel in the second pixel unit subgroup share the second sub pixel in the first pixel unit subgroup. In such a manner, by applying the method of sharing sub pixels for the same pixel unit group, for example, when the original number of pixels is N, N is an integer equal to or greater than 2, the number of pixels can be increased to 3N/2, thereby improving the virtual display resolution of the screen.

By applying the method of sharing sub pixels for the same pixel unit group, the driving method provided by the embodiment of the present invention can improve the virtual display resolution of the screen, with the number of the original pixels being increased to 3/2 times.

Based on the same inventive concept, an embodiment of the present invention provides a display device, wherein the display device comprises any one of the above mentioned organic electroluminescent display devices. The display device can be any product or component with display function, such as mobile phone, tablet computer, TV, display, notebook computer, digital photo frame, navigator and so on. Other essential parts for the display device should be construed as be comprised in the display device, which are not repeated herein, and can not be used to limit the present invention. The implementation of the display device can refer to the embodiments of the above mentioned organic electroluminescent display devices, which will not be repeated herein.

According to the organic electroluminescent display device, the driving method thereof and the display device provided by the embodiments of the present invention, each of the pixel unit groups comprises a first pixel unit subgroup and a second pixel unit subgroup; the first pixel unit subgroup and the second pixel unit subgroup are arranged along a first direction adjacent to each other, and comprise sub pixels with three different colors respectively; wherein the first pixel unit subgroup comprises a sub pixel sequence in an order of a first sub pixel, a second sub pixel and a third sub pixel along a second direction; the second pixel unit subgroup comprises a sub pixel sequence in an order of the third sub pixel, the first sub pixel and the second sub pixel along the second direction; in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal. In such a manner, the regular staggered arrangement of sub pixels with the same color on the basal substrate can be ensured. During the manufacture of a corresponding metal mask plate, the distance between adjacent openings corresponding to the sub pixels with the same color in the metal mask plate can be relatively large, improving the strength of the metal mask plate; this is beneficial for manufacturing small-sized sub pixels, thereby further improving the resolution of the organic electroluminescent display device.

The embodiments of the present invention provide an organic electroluminescent display device, a driving method thereof and a display device. Each of the pixel unit groups comprises a first pixel unit subgroup and a second pixel unit subgroup; the first pixel unit subgroup and the second pixel unit subgroup are arranged along a first direction adjacent to each other, and comprise sub pixels with three different colors respectively; wherein the first pixel unit subgroup comprises a sub pixel sequence in an order of a first sub pixel, a second sub pixel and a third sub pixel along a second direction; the second pixel unit subgroup comprises a sub pixel sequence in an order of the third sub pixel, the first sub pixel and the second sub pixel along the second direction; in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal. In such a manner, the regular staggered arrangement of sub pixels with the same color on the basal substrate can be ensured. During the manufacture of a corresponding metal mask plate, the distance between adjacent openings corresponding to the sub pixels with the same color in the metal mask plate can be relatively large, improving the strength of the metal mask plate; this is beneficial for manufacturing small-sized sub pixels, thereby further improving the resolution of the organic electroluminescent display device.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. An organic electroluminescent display device comprising a basal substrate and several pixel unit groups arranged in a matrix on the basal substrate; each of the pixel unit groups comprising a first pixel unit subgroup and a second pixel unit subgroup; the first pixel unit subgroup and the second pixel unit subgroup are arranged along a first direction adjacent to each other, and comprise sub pixels with three different colors respectively;

wherein the first pixel unit subgroup comprises a sub pixel sequence in an order of a first sub pixel, a second sub pixel and a third sub pixel along a second direction;

wherein the second pixel unit subgroup comprises a sub pixel sequence in an order of the third sub pixel, the first sub pixel and the second sub pixel along the second direction;

wherein in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal; and wherein in the same pixel unit group, the component of the distance between centers of two adjacent sub pixels with the same color respectively located in the first pixel unit subgroup and the second pixel unit subgroup in the first direction is equal to or less than 3/4 of the component thereof in the second direction.

2. The organic electroluminescent display device according to claim 1, wherein in the same pixel unit subgroup, the distance between centers of two adjacent sub pixels is constant.

3. The organic electroluminescent display device according to claim 1, wherein the sub pixels with the same color have the same size.

4. The organic electroluminescent display device according to claim 1, wherein the first direction is perpendicular to the second direction.

5. The organic electroluminescent display device according to claim 1, wherein the first sub pixel, the second sub pixel and the third sub pixel are selected from a group comprising red sub pixel, green sub pixel and blue sub pixel.

6. The organic electroluminescent display device according to claim 5, wherein in the same pixel unit group, all the sub pixels have the same size.

7. An organic electroluminescent display device comprising:
   a basal substrate and several pixel unit groups arranged in a matrix on the basal substrate; each of the pixel unit groups comprising a first pixel unit subgroup and a second pixel unit subgroup; the first pixel unit subgroup and the second pixel unit subgroup being arranged along a first direction adjacent to each other; and
   sub pixels with three different colors respectively;
   wherein the first pixel unit subgroup comprises a sub pixel sequence in an order of a first sub pixel, a second sub pixel and a third sub pixel along a second direction;
   wherein the second pixel unit subgroup comprises a sub pixel sequence in an order of the third sub pixel, the first sub pixel and the second sub pixel along the second direction;
wherein in the same pixel unit group, the component of the distance between centers of two adjacent first sub pixels respectively located in the first pixel unit subgroup and the second pixel unit subgroup in the second direction, the component of the distance between centers of two adjacent second sub pixels respectively located in the first pixel unit subgroup and the second pixel unit subgroup in the second direction, and the component of the distance between centers of two adjacent third sub pixels respectively located in the first pixel unit subgroup and the second pixel unit subgroup in the second direction, are all equal;
   wherein the first sub pixel, the second sub pixel and the third sub pixel are selected from a group comprising red sub pixel, green sub pixel and blue sub pixel; and
   wherein the size of the third sub pixel is smaller than the size of the first sub pixel and the size of the second sub pixel respectively.

8. The organic electroluminescent display device according to claim 7, wherein in the same pixel unit group, the size of the red sub pixel is same with the size of the green sub pixel; the size of the blue sub pixel is larger than the size of the red sub pixel.

9. The organic electroluminescent display device according to claim 7, wherein in the same pixel unit group:
   the component of the distance between centers of two adjacent third sub pixels respectively located in the first pixel unit subgroup and the second pixel unit subgroup in the first direction is less than ¾ of the component thereof in the second direction;
   the component of the distance between centers of two adjacent first sub pixels respectively located in the first pixel unit subgroup and the second pixel unit subgroup in the first direction is equal to ¾ of the component thereof in the second direction;
   the component of the distance between centers of two adjacent second sub pixels respectively located in the first pixel unit subgroup and the second pixel unit subgroup in the first direction is equal to ¾ of the component thereof in the second direction.

10. The organic electroluminescent display device according to claim 9, wherein each of the pixel unit groups further comprises contact holes one-to-one corresponding to the sub pixels and pixel circuits, each of the sub pixels being connected to a corresponding pixel circuit through a corresponding contact hole; wherein,
    in the first pixel unit subgroup, a first contact hole is located between the first sub pixel and the second sub pixel, a second contact hole and a third contact hole are respectively located on both sides of the third sub pixel in the first direction;
    in the second pixel unit subgroup, a fourth contact hole is located between the first sub pixel and the second sub pixel, a fifth contact hole and a sixth contact hole are respectively located on both sides of the third sub pixel in the first direction;
    the first contact hole, the fifth contact hole and the sixth contact hole are aligned in the first direction; the second contact hole, the third contact hole and the fourth contact hole are aligned in the first direction; the first contact hole and the second contact hole are aligned in the second direction; the fifth contact hole and the third contact hole are aligned in the second direction; the sixth contact hole and the fourth contact hole are aligned in the second direction.

11. The organic electroluminescent display device according to claim 10, wherein the third sub pixel is a green sub pixel.

12. The organic electroluminescent display device according to claim 10, wherein the third sub pixel comprises a first portion extending along the second direction, and an extending part extending along the first direction from the first portion;
    in the first pixel unit subgroup, the second contact hole and the third contact hole are respectively located on both sides of the first part of the third sub pixel; and the extending part of the third sub pixel is at least located on a side of the second contact hole;
    in the second pixel unit subgroup, the fifth contact hole and the sixth contact hole are respectively located on both sides of the first part of the third sub pixel; and the extending part of the third sub pixel is at least located on a side of the sixth contact hole.

13. The organic electroluminescent display device according to claim 11, wherein the size of the blue sub pixel is larger than the size of the red sub pixel.

14. The organic electroluminescent display device according to claim 11, wherein the size of the blue sub pixel is equal to the size of the red sub pixel.

15. The organic electroluminescent display device according to claim 1, wherein the shape of each sub pixel is rectangle.

16. A driving method for the organic electroluminescent display device according to claim 7, wherein the driving method comprises: in the same pixel unit group, the first pixel unit subgroup and the second pixel unit subgroup share at least one sub pixel.

17. A display device, comprising the organic electroluminescent display device according to claim 7.

* * * * *